United States Patent [19]

Dart et al.

[11] 4,235,686

[45] Nov. 25, 1980

[54] PHOTOPOLYMERIZABLE COMPOSITION COMPRISING α,αDIKETONE CATALYST

[75] Inventors: Edward C. Dart; Roger C. Roberts; Antony R. Perry; Jozef Nemcek; Neil B. Graham, all of Runcorn, England

[73] Assignee: Imperial Chemical Industries Limited, London, England

[21] Appl. No.: 848,524

[22] Filed: Nov. 4, 1977

[30] Foreign Application Priority Data

Dec. 29, 1971 [GB] United Kingdom ............... 60396/71

[51] Int. Cl.³ .................. C08G 18/00; C08F 2/46; G03C 1/68
[52] U.S. Cl. .................. 204/159.19; 204/159.23; 204/159.24; 430/270; 430/281; 430/284; 430/285; 430/286; 430/919; 430/921; 430/923; 430/924
[58] Field of Search .............. 96/115 R, 115 P, 35.1; 204/159.15, 159.19, 159.24, 159.23; 260/75 NK, 859 R, 77.5 CR, 37 N, 40 TN; 430/270, 281, 284, 285, 286, 919, 921, 923, 924

[56] References Cited

U.S. PATENT DOCUMENTS

| 3,658,531 | 4/1972 | Kurtz ............................. 96/115 P X |
| 3,677,920 | 7/1972 | Kai et al. ........................ 204/159.15 |
| 3,732,097 | 5/1973 | Dickie et al. ..................... 96/115 R |
| 3,759,807 | 9/1973 | Osborn et al. ................... 204/159.23 |
| 3,840,369 | 10/1974 | Carlick et al. ............................. 96/33 |
| 3,864,133 | 2/1975 | Hisamatsu et al. ................ 96/115 P |
| 3,886,229 | 5/1975 | Hutchinson et al. ............ 260/859 R |
| 4,071,424 | 1/1978 | Dart et al. ...................... 204/159.15 |

OTHER PUBLICATIONS

Kosar, "Light Sensitive Systems", pp. 160, 161, 184, 187; 1965.

*Primary Examiner*—Edward C. Kimlin
*Attorney, Agent, or Firm*—Cushman, Darby & Cushman

[57] ABSTRACT

A polymeric composition which is capable of being shaped and which preferably is in the form of a sheet, the composition being formed by partially reacting a mixture of (a) the precursors of a polyurethane comprising at least one polyfunctional compound capable of reacting with isocyanate groups and at least one polyisocyanate, and, (b) the precursors of a cured polyester resin comprising at least one ethylenically unsaturated polyester and at least one ethylenically unsaturated monomer copolymerizable therewith, and the composition containing at least one alpha, alpha diketone as a photosensitive catalyst.

13 Claims, No Drawings

PHOTOPOLYMERIZABLE COMPOSITION COMPRISING α,αDIKETONE CATALYST

This invention relates to a polymeric composition which is capable of being shaped.

In our British Pat. Nos. 1,272,984 and 1,279,673 we have described, inter alia, polymeric compositions which are capable of being shaped, and in particular compositions in the form of shaped articles of simple profile, e.g. sheets, which are capable of being further shaped. The compositions are produced by partially reacting a mixture of the precursors of a polyurethane and the precursors of a cured polyester resin. The partially reacted compositions may be shaped, or may be further shaped, as the case may be, by conventional means, for example, by compression moulding, by draping over a mould, or by vacuum forming. After shaping, or further shaping, has been effected the resultant article may be converted into a rigid shaped article by completing reaction of the mixture of precursors.

The present invention relates to a polymeric composition of the type described in which the aforementioned reaction of the mixture of precursors may be completed by means of photosensitised polymerisation.

The present invention provides a polymeric composition which is capable of being shaped and which is formed by partially reacting a mixture of (a) the precursors of a polyurethane comprising at least one polyfunctional compound capable of reacting with isocyanate groups and at least one polyisocyanate, and (b) the precursors of a cured polyester resin comprising at least one ethylenically unsaturated polyester and at least one ethylenically unsaturated monomer copolymerisable therewith, (a) and (b) being present in the mixture in a proportion by weight in the range (a):(b) 5%:95% to 95%:5% and the mixture being reacted to an extent such as to produce a handlable composition which is capable of being shaped, the composition containing at least one photosensitive catalyst capable of initiating copolymerisation of the ethylenically unsaturated polyester and the ethylenically unsaturated monomer upon exposure of the composition to radiation.

The composition may, for example, be in the form of a dough but it is desirably in the form of a shaped article of simple profile which is capable of being further shaped. Suitably, the shaped article of simple profile is a planar article, for example, a film or sheet, although it may, for example, be a tubular article, e.g. a pipe.

In the mixture of precursors the precursors of the polyurethane are preferably substantially or completely free of ethylenic unsaturation and in the cured polyester resin precursors the ethylenically unsaturated polyester molecules preferably contain at least two groups reactive with isocyanate groups such that the ethylenically unsaturated polyester may react with the polyisocyanate.

It is also desirable that the mixture of precursors is homogeneous by which we mean that there is desirably no gross phase separation in the mixture which is visible to the unaided eye although we do not exclude the possibility of there being a slight haziness in the mixture.

In the mixture of precursors different types of reaction may take place. Thus, the polyisocyanate may react with the polyfunctional compound containing isocyanate-reactive groups and with the ethylenically unsaturated polyester, where the polyester also contains isocyanate-reactive groups. Furthermore, the ethylenically unsaturated monomer may also react with the ethylenically unsaturated polyester by copolymerising with the ethylenically unsaturated groups in the polyester.

Desirably, in the composition of the present invention, the precursors should have reacted to such an extent as to produce a composition which is non-tacky although this is not essential. Reaction should have proceeded at least to the extent that the composition which is produced is handlable, that is, is self supporting and is not so fluid as to flow substantially under its own weight. On the other hand, reaction should not have proceeded to the extent that the composition is no longer capable of being shaped, or of being further shaped when in the form of a shaped article of simple profile. Desirably the composition which is produced is pliable such that it can be shaped by hand, for example, when it is in the form of a sheet it is desirably sufficiently pliable that it can be draped by hand over a mould.

In forming the composition of the present invention it is preferred that the mixture of precursors is reacted to the extent that the polyisocyanate, the polyfunctional compound and the ethylenically unsaturated polyester, where the polyester contains isocyanate-reactive groups, are substantially or completely reacted, and the ethylenically unsaturated polyester and the ethylenically unsaturated monomer are substantially uncopolymerised. The partial reaction of the mixture of precursors may be effected in a suitable mould in order to produce a shaped article of simple profile, e.g. a sheet. The composition may be produced in a continuous manner, e.g. by continuously charging the mixture to a moving support surface, e.g. a moving belt, and causing or allowing the partial reaction to take place on the support surface. When in the form of a sheet the sheet may suitably have a thickness in the range 1/16" to ½".

Reaction of the mixture of precursors may be controlled by control of temperature and by the use of catalysts and inhibitors. For example, reaction of the polyisocyanate with the polyfunctional compound and with the ethylenically unsaturated polyester, where the polyester contains isocyanate-reactive groups, may be catalysed by urethane catalysts known in the art, for example, tertiary amines and metal salts, e.g. stannous octoate and dibutyl tin dilaurate.

If necessary, copolymerisation of the ethylenically unsaturated monomer with the ethylenically unsaturated polyester may be inhibited by the use of suitable inhibitors for free-radical reactions, e.g. quinones. However, as the aforementioned reaction generally proceeds at a relatively low temperature and the aforementioned copolymerisation generally proceeds at a relatively high temperature it is preferred that the temperature is controlled in order that the aforementioned reaction is effected without a substantial amount of copolymerisation being effected.

If any copolymerisation is effected it should not be such as to make the composition incapable of being shaped. Furthermore, in order to decrease the amount of the aforementioned copolymerisation it is desirable to effect the reaction of the polyurethane precursors together with the ethylenically unsaturated polyester in a light which does not activate the photosensitive catalysts. Suitably, the reaction may be effected in the dark or in subdued lighting.

In producing the composition of the present invention it is desirable that the molar proportion of isocyanate groups in the polyisocyanate to the total of the isocyanate-reactive groups in the polyfunctional compound and the ethylenically unsaturated polyester, where the polyester contains isocyanate-reactive groups, be in the range 0.8:1 to 1.2:1, more preferably in the range 0.9:1 to 1.1:1, although proportions outside these ranges may be used if desired.

Shaping of the composition of the present invention, or further shaping where the composition is in the form of a shaped article of simple profile, may be effected, for example, by vacuum forming, by blow moulding or by compression moulding or, where the article of simple profile is sufficiently flexible, merely by draping the article over a mould. After the composition has been shaped, or after the article of simple profile has been further shaped, the resultant shaped article may be converted to a rigid article by exposing the article to radiation of a wavelength which activatives the photosensitive catalyst and which effects copolymerisation of the ethylenically unsaturated monomer with the ethylenically unsaturated polyester.

Where the article is not capable of retaining its shape unaided after shaping has been effected the article must be constrained into the desired shape. Clearly, it must be possible, when the article is so constrained, for the radiation which activates the photosensitive catalyst to strike the surface of the article. The article should thus not be in an opaque mould and it is convenient, for example, to hold the article on a vacuum former or in a jig and to retain the article on the former or in the jig during exposure of the article to radiation at least for a time such that sufficient copolymerisation may be effected for the article to be able to retain its shape.

Alternatively, the article may be held in a mould which is transparent to the radiation which is used to activate the photosensitive catalysts.

The radiation which is used to effect the copolymerisation of the ethylenically unsaturated monomer and the ethylenically unsaturated polyester should have a wavelength which is absorbed by and which activates the photosensitive catalyst. Visible light or ultraviolet radiation may be used, or a combination of visible light and ultraviolet radiation, for example, sunlight. It is preferred to use visible light in order that the use of screening which may be necessary to protect an operator from the source of radiation where the source emits ultraviolet radiation, may be decreased or avoided.

In the polyurethane precursors isocyanate-reactive groups in the polyfunctional compound may be, for example, —OH, or —COOH or NH$_2$ groups. For example, the polyfunctional compound may be a polyol, e.g. a polyether or a polyester polyol. The polyfunctional compound may be one or more of those described in the aforementioned British Patent Specifications the disclosures of which are incorporated herein.

Similarly, the polyisocyanate for use in the polyurethane precursors may be any one or more of those described in the aforementioned British Patent Specifications although, on account of the desirable properties, and in particular the good combination of properties, of the article produced by completing the reaction of the mixture of precursors it is preferred that the polyisocyanate should consist of, or comprise a substantial proportion of, at least one polyisocyanate having the structure

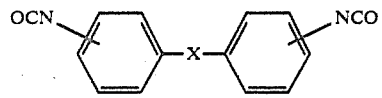

where X is a divalent group, especially a group having the structure —O—, —SO$_2$—, or $-(CH_2)_n-$, where n is a whole number in the range 1 to 3, or hydrocarbyl derivative thereof. For example the polyisocyanate may be 4:4'-diphenylmethane diisocyanate.

The ethylenically unsaturated polyester in the polyester resin precursors preferably contains isocyanate-reactive groups. Suitable isocyanate-reactive groups include —OH and —COOH groups. The ethylenically unsaturated polyester may be any one or more of those described in the aforementioned British Patent Specifications. Similarly, the ethylenically unsaturated monomer copolymerisable with the ethylenically unsaturated polyester may, for example, be a vinyl monomer and may be any one or more of the vinyl monomers described in the aforementioned British Patent Specifications.

The proportion of monomer copolymerisable with the ethylenically unsaturated polyester to ethylenically unsaturated polyester in the cured polyester resin precursors may, for example, be in the range 30% to 90% by weight of at least one ethylenically unsaturated polyester to 70% to 10% by weight of at least one monomer copolymerisable therewith. More suitably, the said precursors comprise from 50% to 70% by weight of at least one ethylenically unsaturated polyester and from 50% to 30% by weight of at least one monomer copolymerisable therewith.

The polyurethane precursors may be difunctional in which case the precursors, if they were to be reacted together in the absence of the cured polyester resin precursors, would be capable of forming a linear polyurethane. On the other hand, one or both of the polyfunctional compound and the polyisocyanate in the polyurethane precursors may have a functionality of greater than two in which case, if they were to be reacted together in the absence of the cured polyester resin precursors, would be capable of forming a cross-linked polyurethane.

The photosensitive catalyst may include, for example, a photosensitive uranyl compound.

The uranyl compound may be a uranyl salt. Suitable uranyl salts include, for example, inorganic uranyl salts, e.g. uranyl nitrate, uranyl sulphate, and uranyl halides, e.g. uranyl chloride and uranyl 2-ethyl hexyl phosphate, and uranyl salts of organic acids, for example, salts of monobasic or dibasic acids, e.g. salts of fumaric acid, acetic acid, propionic acid, butyric acid, glutaric acid, benzoic acid, oxalic acid or succinic acid. Where the photosensitive catalyst includes a uranyl compound then the compound is desirably substantially free of water of crystallisation otherwise undesirable reaction with the polyisocyanate may take place.

The radiation used may have a wavelength in the range 230 m$\mu$ to 600 m$\mu$. If desired, the radiation used may have a wavelength in the visible region of the spectrum alone, i.e. in the range 400 m$\mu$ to 700 m$\mu$. In this latter case the radiation may suitably have a wavelength in the range 400 m$\mu$ to 600 m$\mu$.

Other suitable photosensitisers for use in the photosensitive catalyst include photosensitive dyes activatable by visible light, for example, rose bengal, eosein, erythrosin and phloxin, and aromatic disulphides, e.g. diphenyl disulphide.

As photosensitiser for use in the photosensitive catalyst there may be mentioned a photosensitiser having the structure

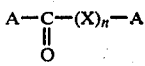  (I)

where X is

where $R_1$ to $R_4$ which may be the same or different, are hydrogen or hydrocarbyl groups, n is 0 or 1, and the groups A, which may be the same or different, are hydrocarbyl or substituted hydrocarbyl groups, the groups A being aromatic or substituted aromatic when n is 1 and X is

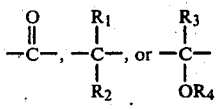

and when n is 0.

Where the groups A are hydrocarbyl they may be aliphatic or aromatic.

Within the scope of the term aliphatic groups we include cycloaliphatic groups and aliphatic groups carrying aromatic substituents, that is, aralkyl groups. Similarly, within the scope of the term aromatic group we include groups carrying alkyl substituents, that is, alkaryl groups.

The aromatic group may be a benzenoid aromatic group, e.g. a phenyl group, or it may be a non-benzenoid cyclic group which is recognised in the art as possessing the characteristics of a benzenoid aromatic group.

The groups A, especially when aromatic, may carry substituent groups other than hydrocarbyl, e.g. halogen or alkoxy. Alternatively, the groups A may be linked together to form a divalent group, for example, a fused divalent aromatic ring system.

Particularly preferred photosensitisers on account of the rapid rates at which the ethylenically unsaturated monomer may be copolymerised with the ethylenically unsaturated polyester are α-diketones having the structure I in which X is

and n is 1 and fluorenone. In general, the α-diketones and fluorenone are capable of being excited by radiation in the visible region of the spectrum, that is, by light having a wavelength greater than 400 mµ, e.g. in the wavelength range 400 mµ to 500 mµ, although ultraviolet radiation, or a mixture of ultraviolet radiation and visible light, may be used. Suitable α-diketone photosensitisers include biacetyl, benzil, α-naphthil, β-naphthil, p:p′-tolil, p:p′-furil, p:p′-dimethoxybenzil and p:p′-dichlorobenzil.

Other suitable photosensitisers of structure I include benzophenone, benzoin and benzoin alkyl ethers, e.g. benzoin methyl ether, α-naphthoin, β-naphthoin, p:p′-dimethoxybenzoin, p:p′-dichlorobenzoin, phenanthraquinone, camphorquinone and acenaphthene quinone.

We have found especially where the photosensitive catalyst includes as photosensitiser a uranyl compound, or a photosensitive dye, or a compound having the structure I, that the rate at which the ethylenically unsaturated monomer may be copolymerised with the ethylenically unsaturated polyester may be increased if the photosensitive catalyst, in addition to the photosensitiser, includes at least one reducing agent capable of reducing the photosensitiser when the photosensitiser is in an excited state.

Suitable reducing agents include compounds having the structure

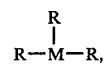

where M is an element of Group Vb of the Periodic Table of the Elements and the units R, which may be the same or different, are hydrogen atoms, hydrocarbyl groups, substituted hydrocarbyl groups or groups in which two units R together with the element M form a cyclic ring system, no more than two of the units R being hydrogen atoms, and where the element M is attached directly to an aromatic group R, at least one of the groups R has a

group attached to M.

The Periodic Table of the Elements referred to is that published in "Advanced Inorganic Chemistry", second edition, by F A Cotton and G Wilkinson (Interscience 1966).

Preferably, the reducing agent having the structure

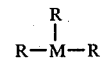

is free of aromatic groups attached directly to the element M.

The element M in the reducing agent may be, for example, phosphorus or more preferably nitrogen. If desired, M may be arsenic or antimony.

Particularly preferred reducing agents include amines, e.g. propylamine, n-butylamine, pentylamine, hexylamine, dimethylamine, diethylamine, dipropylamine, di-n-butylamine, dipentylamine, trimethylamine, triethylamine, tripropylamine, tri-n-butylamine, tripentylamine, dimethylaminoethyl methacrylate, dimethylaminoethanol, dimethylaminopropanol, long chain fatty amines, e.g. $C_{18}H_{37}NMe_2$, N,N′-dimethylaniline and N-methyl diphenylamine, ethylene diamine, trimethylene diamine tetramethylene diamine, pentamethylene diamine or hexamethylene diamine, or N-hydrocarbyl, especially N-alkyl derivatives thereof, e.g. N,N,N′,N′-tetramethyl ethylene diamine.

The photosensitive catalyst, which is desirably included in the mixture of precursors before a substantial amount of reaction of the precursors has taken place, may suitably be present in a proportion of, for example 0.5% to 5% by weight of the cured polyester resin precursors in the mixture from which the composition of the present invention is derived. However, if desired concentrations outside this range may be used.

Thus, the photosensitiser in the photosensitive catalyst is desirably present in the aforementioned concentration range, and, where the photosensitive catalyst includes a reducing agent, the reducing agent also is desirably present in this concentration range.

Suitable sources of radiation which may be used to effect the copolymerisation of the ethylenically unsaturated polyester and the ethylenically unsaturated monomer include sunlight, blue light, daylight fluorescent tubes and tungsten halogen lamps.

In order that the article made from the composition of the present invention by completing the copolymerisation of the ethylenically unsaturated monomer with the ethylenically unsaturated polyester should possess a good balance of properties it is preferred that the mixture from which the composition is derived comprise precursors of a polyurethane to precursors of a cured polyester resin in a proportion by weight in the range 30%:70% to 70%:30%, and more preferably in a proportion by weight in the range 40%:60% to 60%:40%.

The composition of the present invention may also include fibrous material in order that the properties of the article produced from the composition by completing copolymerisation of the ethylenically unsaturated polyester and the ethylenically unsaturated monomer may have improved properties, for example, improved impact strength and flexural properties. Suitable fibrous materials include glass, e.g. in the form of mat, chopped rovings or continuous floc, asbestos, carbon, or fibres of an organic polymer, e.g. of nylon or poly(ethylene terephthalate). The fibrous material may be present in a proportion of, for example, 5% to 60% or even 70% by weight of the total weight of the fibre and the composition and may be incorporated into the article by methods known in the art of reinforced resin technology.

The composition of the present invention may also include particulate filler material, for example, talc, sand, titanium dioxide, clays and calcium carbonate. Suitably, the particulate material is present in a proportion in the range 5% to 60% or even 70% by weight of the total weight of the particulate material and the composition.

The composition may contain both fibrous material and particulate filler material.

Where the composition contains a fibrous or particulate filler a photosensitive catalyst should be chosen which is activated by radiation having a wavelength which is not absorbed to an excessive extent by the fibre or filler present in the composition. Preferably, the fibre or filler should be transparent to radiation at the wavelength which activates the photosensitive catalyst. Where the fibre or filler absorbs ultraviolet radiation but absorbs little or no radiation in the visible region of the spectrum those photosensitive catalyst in the compositions of our invention which are activated by visible light, for example, the α-diketones, fluorenone and uranyl compounds, are especially useful.

The composition of our invention may also include colouring pigments, antioxidants, antiozonants, ultraviolet stabilisers and mould release agents.

The compositions are useful in the production of articles, for example, boxes, tanks, e.g. water tanks, trays, wall panels and tables. The compositions may be used as a repair material, e.g. they may be used in sealing holes, for example in vessels and in car bodies.

The invention is now illustrated by the following Examples in which all parts are expressed as parts by weight.

EXAMPLE 1

32 Parts of 4:4'-diphenylmethane diisocyanate were charged to a reaction vessel and heated at a temperature of 50° C. until clear.

A photosensitive catalyst of 0.96 part of benzil and 1.92 parts of dimethylaminoethyl methacrylate were added to a mixture of 29.8 parts of an ethylenically unsaturated polyester and 18.2 parts of styrene and the mixture heated to 50° C. and mixed with the 4:4'-diphenylmethane diisocyanate. The polyester had a hydroxyl value of 40.4 mg. KOH $g^{-1}$ and an acid value of 4.5 mgKOH$g^{-1}$ and was formed by condensation of propylene glycol, fumaric acid and isophthalic acid (fumaric acid:isophthalic acid ratio 3:1).

To the thus formed solution there was added 43 parts of oxypropylated glycerol having a molecular weight of 600. 0.1 part of dibutyl tin dilaurate was added to the solution and the solution, which contained 61% by weight of polyurethane precursors and 39% by weight of cured polyester resin precursors was degassed by connecting the reaction vessel containing the solution to a vacuum. The degassed solution was charged to a mould formed by a pair of 12 in.×12 in glass plates separated by a ½ in. wide by 3/16 in. thick neoprene rubber gasket, the solution being charged to the mould through a small gap in the gasket.

The gap in the gasket was plugged and the mould allowed to stand at room temperature in the dark for 16 hours in order to allow the reaction between the ethylenically unsaturated polyester, the 4:4'-diphenylmethane diisocyanate and the oxypropylated glycerol to proceed.

Thereafter the mould was opened and the resultant sheet removed from the mould. The sheet was non-tacky pliable and flexible and could be moulded by vacuum forming, or by clamping into a desired shape.

Samples of the sheet removed from the mould were exposed to a number of different light sources to produce a rigid sheet. In Table 1 the times required to produce rigid sheets from the pliable, flexible sheets upon exposure of the sheets to a number of different light sources are given.

TABLE 1

| Light Source | Time to produce rigid sheet |
| --- | --- |
| Direct sunlight | 2 hours |
| Daylight, no direct sunlight | 6 hours |
| 1 Kwatt tungsten halogen lamp* | 2 hours |
| 8 × 20 watt blue fluorescent tubes** | 1 hour |
| 10 × 20 watt ultraviolet fluorescent tubes*** | ½ hour |

*Supplied by Thorn Lighting Ltd. visible light with a maximum emission at 500–600mμ
**Supplied by Thorn Lighting Ltd. mainly visible light with a maximum emission at 430mμ and including a small proportion of ultraviolet radiation.
***Supplied by Thorn Lighting Ltd. ultraviolet radiation with a maximum emission at 350mμ

TABLE 2

| Photosensitive Catalyst | Time to produce rigid sheet upon exposure to light source | | | | |
|---|---|---|---|---|---|
| | Direct Sunlight | Daylight, no direct sunlight | 1 Kwatt tungsten halogen lamp | 8 × 20 watt blue fluorescent tubes | 60 × 20 watt ultra violet fluorescent tubes |
| 0.096 part fluorenone 1.92 parts dimethylaminoethyl methacrylate | 2 hours | 6 hours | 2 hours | 1 hour | ½ hour |
| 0.096 part uranyl chloride 1.92 parts dimethylaminoethyl methacrylate | 2 hours | 6 hours | 2 hours | 1 hour | ½ hour |
| 1.92 parts biacetyl | 4 hours | 10 hours | 4 hours | 3½ hours | 1½ hours |
| 0.096 part fluorenone* 1.92 parts dimethylaminoethyl methacrylate | 4 hours | 10 hours | 4 hours | 3½ hours | 1½ hours |

*the solution charged to the mould contained 0.48 part of a blue pigment sold commercially as Crystic blue (Scott Bader and Company Ltd.)

EXAMPLE 2

The procedure of Example 1 was followed except that the nature of the photosensitive catalyst was varied. As in Example 1 the resultant sheets were non-tacky, pliable and flexible and could be moulded by vacuum forming or by clamping into a desired shape. In Table 2 the times required to produce rigid sheets from the pliable, flexible sheets containing different photosensitive catalysts upon exposure of the sheets to a number of different light sources are given.

EXAMPLE 3

The procedure of Example 1 was repeated except that 0.96 part of benzoin methyl ether was used as the photosensitive catalyst and the non-tacky flexible, pliable sheet which was produced was 6/100 in. thick.

The sheet was mouldable by vacuum forming. In Table 3 the times required to produce rigid sheets from the pliable, flexible sheets upon exposure of the sheets to a number of different light sources is given.

TABLE 3

| Light Source | Time to produce rigid sheet |
|---|---|
| Direct sunlight | 4 hours |
| 8 × 20 watt blue fluorescent tubes | ½ hour |
| 60 × 20 watt ultraviolet fluorescent tubes | 5 minutes |

EXAMPLE 4

The procedure of Example 1 was repeated except that 1.2 parts of benzoin were used as the photosensitive catalyst, and 17 parts of 4:4'-diphenylmethane diisocyanate, 23 parts of oxypropylated glycerol of molecular weight 600, 47.4 parts of the ethylenically unsaturated polyester as used in Example 1, 12.6 parts of styrene and 0.1 part of dibutyl tin dilaurate were used. The solution charged to the mould contained 40% by weight of polyurethane precursors and 60% by weight of cured polyester resin precursors.

The flexible, pliable 6/100 in. thick sheet removed from the mould was non-tacky, flexible and pliable and could be moulded by vacuum forming and by clamping into any desired shape. A sample of the sheet was exposed to the radiation from 60×20 watt ultraviolet fluorescent tubes and was cured to a rigid sheet in 4 minutes.

EXAMPLE 5

The procedure of Example 1 was repeated except that the 4:4'-diphenylmethane diisocyanate was replaced by 21.5 parts of hexamethylene diisocyanate and the degassed solution was allowed to stand in a mould for 7 days in the dark at room temperature in order to allow the reaction between the ethylenically unsaturated polyester, the hexamethylene diisocyanate and the oxypropylated glycerol to proceed. The solution contained 57.5% by weight of polyurethane precursors and 42.5% by weight of cured polyester resin precursors.

The time required to produce a rigid sheet from the resultant non-tacky, pliable, flexible sheet upon exposure to 8×20 watt blue fluorescent tubes was 15 minutes.

EXAMPLE 6

The procedure of Example 1 was followed to produce a sheet except that the polyester used in Example 1 was replaced by 24 parts of a polyester having an acid value of 35 mg KOH $g^{-1}$ which was formed by condensing oxypropylated bisphenol-A and fumaric acid, the styrene was replaced by 24 parts of vinyl toluene, the dimethylaminoethyl methacrylate was replaced by 1.92 parts of N,N,N'-N'-tetramethyl ethylene diamine, and the gasket in the mould was ⅛ in. thick. The solution contained 61% by weight of polyurethane precursors and 39% by weight of cured polyester resin precursors.

The resultant non-tacky, flexible, pliable sheet was formed into the shape of a cylinder, clamped in position, and irradiated with a 400 watt lamp (MBI PAR 64, Thorn Lighting Ltd.) which emitted visible light containing a small proportion of ultraviolet radiation. After irradiation for 1 hour a rigid cylinder had been formed.

EXAMPLE 7

The procedure of Example 1 was followed to produce a sheet from a mixture of 70% by weight of polyurethane precursors and 30% by weight of cured polyester resin precursors except that 18.6 parts of the polyester, 11.4 parts of styrene, 28.2 parts of 4:4'-diphenylmethane diisocyanate and 41.8 parts of oxypropylated glycerol were used and in place of the dimethylaminoethyl methacrylate there was used 1.92 parts of dimethylamino ethanol.

The resultant non-tacky, flexible, pliable sheet was draped over a dome-shaped mould and irradiated following the procedure described in Example 6 for 5 hours to produce a rigid, dome-shaped article.

EXAMPLE 8

The procedure of Example 7 was followed to produce a sheet from a mixture of 30% by weight of polyurethane precursors and 70% by weight of cured polyester resin precursors except that 43.4 parts of the polyester, 26.6 parts of styrene, 13.6 parts of 4:4'-diphenylmethane diisocyanate and 16.4 parts of oxypropylated glycerol were used and, in order to produce the non-tacky flexible, pliable sheet the mixture was allowed to stand in the dark in the mould for 2 days at room temperature and was thereafter heated in the dark for 2 hours at 70° C.

The sheet removed from the mould was moulded and irradiated for ¾ hour following the procedure described in Example 7 to produce a rigid, dome-shaped article.

EXAMPLE 9

The procedure of Example 1 was followed to produce a sheet from a mixture of 50% by weight of polyurethane precursors and 50% by weight of cured polyester resin precursors except that 16.7 parts of toluene diisocyanate (in place of the 4:4'-diphenylmethane diisocyanate), 31 parts of the polyester, 19 parts of styrene, 33.3 parts of oxypropylated glycerol, and 1.92 parts of dimethylaminopropan-1-ol (in place of the dimethylaminoethyl methacrylate) were used.

The resultant non-tacky flexible, pliable, sheet was readily mouldable. A sample of the sheet was placed midway between two of the lamps as used in Example 6 placed 5 ft. apart and irradiated for 3 hours to produce a rigid sheet.

EXAMPLE 10

The procedure of Example 1 was followed to produce a sheet from a mixture of 60% by weight of polyurethane precursors and 40% by weight of cured polyester resin precursors except that 33.9 parts of 4:4'-diphenylmethane diisocyanate, 1.92 parts of dimethylaminoethanol (in place of the dimethylaminoethyl methacrylate), 24.8 parts of the polyester, 15.2 parts of styrene, and 26.1 parts of a polyester polyol having an acid value of 1 mg KOH $g^{-1}$ and a hydroxyl value of 545 mg KOH $g^{-1}$ and formed by condensing adipic acid, glycerol and diethylene glycol in a molar proportion of 3:1.23:6.7 were used.

A sample of the resultant non-tacky, flexible, pliable sheet was moulded into the shape of a tray having a lip ½ in. high, the tray was clamped in position, and was irradiated following the procedure described in Example 9 for 1 hour to produce a rigid tray.

EXAMPLE 11

46.5 parts of the polyester as used in Example 1, 28.5 parts of styrene, 43 parts of oxypropylated glycerol and 37.5 parts of calcium carbonate were thoroughly mixed at room temperature. 1.92 parts of dimethylaminoethanol, 0.96 part of benzil, 0.01 part of dibutyl tin dilaurate and 32 parts of 4:4'-diphenylmethane diisocyanate (previously heated to 50° C.) were added to the mixture and a non-tacky, flexible pliable sheet was formed following the procedure described in Example 1. The sheet was formed from a mixture of 50% by weight of polyurethane precursors and 50% by weight of cured polyester resin precursors.

The sheet was formed into the shape of a tray following the procedure described in Example 10 and was irradiated following the procedure described in Example 9 for 1 hour to produce a rigid tray.

EXAMPLE 12

The procedure of Example 1 was followed to produce a mixture of 32 parts of 4:4'-diphenylmethane diisocyanate, 1 part of benzil, 2 parts of dimethylaminoethanol (in place of the dimethylaminoethyl methacrylate), 24 parts of the polyester as used in Example 6 (in place of the polyester used in Example 1), 24 parts of styrene, 43 parts of oxypropylated glycerol and 0.1 part of dibutyl tin dilaurate. 24 parts of the resultant mixture containing 61% by weight of polyurethane precursors and 39% by weight of cured polyester resin precursors were degassed and poured onto a sheet of poly(ethylene terephthalate) film on a glass plate. 8 parts of chopped strand glass mat (FG 3001 Fiberglass Ltd.) were placed on the mixture and a poly(ethylene terephthalate) film and a glass plate were placed on top of the mixture.

After standing in the dark at room temperature for 16 hours a non-tacky, flexible, pliable sheet was recovered and the sheet was irradiated following the procedure of Example 6 to produce a rigid sheet.

What we claim is:

1. A polymeric composition capable of being shaped and which is formed by partially reacting a mixture comprising:
    (a) 5% to 95% by weight of the precursors of a polyurethane comprising at least one polyisocyanate and at least one polyol free of ethylenic unsaturation and having isocyanate-reactive groups;
    (b) 95% to 5% by weight of the precursors of a cured polyester resin comprising at least one ethylenically unsaturated polyester reactive with said polyisocyanate and at least one ethylenically unsaturated monomer copolymerisable therewith, wherein the mixture is reacted to an extent such as to produce a handleable composition which is capable of being shaped; and
    (c) at least one photosensitive catalyst capable of initiating copolymerisation of the ethylenically unsaturated polyester and the ethylenically unsaturated monomer upon exposure of the composition to visible radiation said photosensitive catalyst comprising at least one photosensitiser and at least one compound having the structure

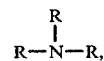

where the units R, which may be the same or different, are hydrogen atoms, hydrocarbyl groups, substituted hydrocarbyl groups or groups in which two units R together with N form a cyclic ring system, no more than two of the units R being hydrogen atoms, and where N is attached directly to a hydrocarbyl group R, at least one of the groups R has a

group attached to N, said photosensitiser having the structure

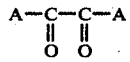

wherein the groups A, which may be the same or different, are hydrocarbyl or substituted hydrocarbyl groups, and wherein the groups A may be further linked together by a direct link or by a divalent hydrocarbyl group or wherein the groups A together form a fused aromatic ring.

2. A composition as claimed in claim 1 in which, in the cured polyester resin precursors, the ethylenically unsaturated polyester molecules contain at least two groups reactive with isocyanate groups.

3. A composition as claimed in claim 1 which is in the form of a shaped article of simple profile which is capable of being further shaped.

4. A composition as claimed in claim 3 in which the shaped article capable of being further shaped is in the form of a sheet.

5. A composition as claimed in claim 1 in which in the mixture the precursors of a polyurethane and the precursors of a cured polyester resin are present in a proportion by weight in the range 30%:70% to 70%:30%.

6. A composition as claimed in claim 1 which contains at least one fibrous material.

7. A composition as claimed in claim 6 in which the fibrous material is present in a proportion in the range 5% to 70% by weight of the total weight of the fibrous material and the composition.

8. A composition as claimed in claim 1 which contains at least one particulate material.

9. A composition as claimed in claim 9 in which the particulate material is present in a proportion in the range 5% to 70% by weight of the total weight of the particulate material and the composition.

10. A composition as claimed in claim 1 in which the polyisocyanate, the polyol compound and the ethylenically unsaturated polyester, where the polyester contains isocyanate-reactive groups, are substantially reacted, and in which the ethylenically unsaturated polyester and the ethylenically unsaturated monomer are substantially uncopolymerised.

11. A composition as claimed in claim 1 in which the photosensitive catalyst is present in a proportion of 0.5% to 5% by weight of the cured polyester resin precursors in the mixture from which the composition is derived.

12. A composition as claimed in claim 1 in which the photosensitiser is at least one of benzil and biacetyl.

13. A composition as claimed in claim 1 in which the compound having the structure

is selected from dimethylamino-ethyl methacrylate, dimethylaminoethanol, dimethylaminopropanol, and N,N,N',N'-tetramethyl ethylene diamine.

* * * * *

UNITED STATES PATENT AND TRADEMARK OFFICE
CERTIFICATE OF CORRECTION

PATENT NO. : 4,235,686

DATED : November 25, 1980

INVENTOR(S) : Edward C. DART et al

It is certified that error appears in the above—identified patent and that said Letters Patent is hereby corrected as shown below:

Please insert on the cover page of the patent:

--     RELATED U.S. APPLICATION DATA

[63] Continuation of Serial No. 534,422, December 19, 1974, abandoned --

*Signed and Sealed this*

*Twenty-fourth* Day of *March 1981*

[SEAL]

*Attest:*

RENE D. TEGTMEYER

*Attesting Officer*     *Acting Commissioner of Patents and Trademarks*